United States Patent
Schlater et al.

[19]

[11] Patent Number: 6,148,420
[45] Date of Patent: Nov. 14, 2000

[54] METHOD AND APPARATUS FOR ANALYZING SERIAL DATA

[75] Inventors: Rodney T. Schlater; Patricia A. Desautels, both of Colorado Springs, Colo.

[73] Assignee: Agilent Technologies, Palo Alto, Calif.

[21] Appl. No.: 08/954,684

[22] Filed: Oct. 17, 1997

[51] Int. Cl.[7] ...................................................... H02H 3/05
[52] U.S. Cl. ................................................. 714/39; 714/38
[58] Field of Search ................... 714/39, 38, 37

[56] References Cited

U.S. PATENT DOCUMENTS

| | | | |
|---|---|---|---|
| 4,696,004 | 9/1987 | Nakajima et al. | 371/25 |
| 5,347,524 | 9/1994 | I'Anson et al. | 371/29.1 |
| 5,586,266 | 12/1996 | Hershey et al. | 395/200.11 |
| 5,737,520 | 4/1998 | Gronlund et al. | 395/183.15 |
| 5,784,298 | 7/1998 | Hershey et al. | 364/557 |
| 5,889,936 | 3/1999 | Chan | 395/183.15 |
| 5,954,826 | 9/1999 | Herman et al. | 714/46 |

FOREIGN PATENT DOCUMENTS 53-151156  12/1978  Japan .

OTHER PUBLICATIONS

Morrill, J.S., Jr., "Interfacing a parallel-mode logic state analyzer to serial data," HP. Journal, vol. 28, No. 4, pp., Dec. 1976.

*Primary Examiner*—Norman M. Wright

[57] ABSTRACT

The present inventions provides a method and apparatus for analyzing serial data. The invention comprises a serial analyzer which receives serial data from a logic analyzer. The serial analyzer processes the data to convert the serial data into parallel words. A listing tool receives the parallel words and generates a listing to be displayed. The listing generated is arranged in a first column and the sampled serial data is in a second column, so that, a user may view simultaneously the parallel word and the serial data corresponding to it. The listing tool also receives a time and state at which each bit of serial data was captured by the logic analyzer. The listing tool arranges the time of each bit of serial data in a third column, and the state at which each bit of serial data occurred in a fourth column. Thus, the user may simultaneously view on a display the parallel words, the sampled serial data, the time of capture, and the states corresponding to each bit in the serial data. A user interface selects from several windows to configure the logic analyzer, the serial analyzer, and the listing tools. Once configured the user executes the serial analysis procedure.

32 Claims, 10 Drawing Sheets

MATCH LINE TO FIG. 10A

| IP ADDR | PENTIUM (R) W/MMX INVERSE ASSEMBLY | | | DATA | TIME |
|---|---|---|---|---|---|
| HAX | MNEMONICS/HEX | | | HEX | ABSOLUTE |
| 000FE5B8 | ACD08BAD | FC900024 | CODE READ | cpu0 FC900024 | 4.490 ms |
| 000FE5C0 | B9F5E200 | EB00EBEF | CODE READ | cpu0 EB00EBEF | 4.497 ms |
| 000FE5C8 | EBC03300 | 81BA000F | CODE READ | cpu0 81BA000F | 4.504 ms |
| 000FE5B8 | ACD08BAD | FC900024 | CODE READ | cpu0 FC900024 | 4.511 ms |
| 000FE5BC | TARGET: | 000FE5BC | BRANCH TRACE sz 16 | cpu0 00000000 | 4.511 ms |
| 000FE5BC | AD | | LODSW | | |
| 000FE5BD | 8BD0 | | MOV DX,AX | | |
| 000FE5BF | AC | | LODSW | | |
| 000FE5C0 | EE | | OUT | | |
| 000FE5C1 | EB00 | | JMP | | |
| | CAUSING: | 000FE5C5 | BRANCH TRACE | cpu0 00000000 | 4.511 ms |
| 000FF3CD | XX00D6XX | XXXXXXXX | MEM READ | cpu0 00000000 | 4.513 ms |
| G1 000FE5C0 | B9F5E200 | EB00EBEF | CODE READ | cpu0 EB00EBEF | 4.520 ms |
| 000FE5C8 | EBC03300 | 81BA000F | CODE READ | cpu0 81BA000F | 4.527 ms |
| 000FF3CF | 41XXXXXX | XXXXXXXX | MEM READ | cpu0 00000000 | 4.520 ms |
| 000FE5B8 | ACD088AD | FC900024 | CODE READ | cpu0 FC900024 | 4.535 ms |
| 000000D6 | XX01XXXX | XXXXXXXX | I/O WRITE | cpu0 00410000 | 4.536 ms |
| 000FE5C0 | B9F5E200 | EB00EBEF | CODE READ | cpu0 EB00EBEF | 4.543 ms |
| 000FE5C8 | EBC03300 | 81BA000F | CODE READ | cpu0 81BA000F | 4.550 ms |
| 000FE5B8 | ACD08BAD | FC900024 | CODE READ | cpu0 FC900024 | 4.557 ms |
| 000FE5C3 | TARGET: | 000FE5C3 | BRANCH TRACE sz 16 | cpu0 00000000 | 4.557 ms |
| 000FE5C3 | EB00 | | JMP CODE READ | | |
| | CAUSING: | 000FE5C1 | BRANCH TRACE | cpu0 00000000 | 4.557 ms |
| 000FE5C0 | B9F5E200 | EB00EBEF | CODE READ | cpu0 EB00EBEF | 4.565 ms |
| 000FE5C8 | EBC03300 | 81BA000F | CODE READ | cpu0 81BA000F | 4.572 ms |
| 000FE5C5 | TARGET: | 000FE5C3 | BRANCH TRACE | cpu0 00000000 | 4.572 ms |
| 000FE5C5 | E2F5 | | LOOP 000FE5BCH | | |
| | CAUSING: | 000FE5C3 | BRANCH | cpu0 00000000 | 4.572 ms |
| 000FE5B8 | ABC08BAD | FC900024 | CODE READ | cpu0 FC900024 | 4.579 ms |

FIG. 10B

METHOD AND APPARATUS FOR ANALYZING SERIAL DATA

TECHNICAL FIELD OF THE INVENTION

The present invention generally relates to a method and apparatus for analyzing serial data and, more particularly, to a general purpose serial analyzer which can be implemented with a plurality of different communications protocols and which allows a user to view data in a simple and familiar format.

BACKGROUND OF THE INVETON

Currently, there are a very limited number of tools available on the market for looking at serial data. Generally, designers currently look at serial data using logic analyzers or deep memory oscilloscopes. Logic analyzers are used to capture clocked serial data. Once the logic analyzer captures the serial data, the user is required to sift through long vertical one-bit-wide columns of data, which may be thousands of bits deep. Deep memory oscilloscopes are used to capture unclocked serial data, which is even more prevalent than clocked serial data, and to look at the captured data one bit at a time.

Logic analyzers and deep memory oscilloscopes which are currently available on the market do not provide the designer with a convenient, easy-to-read format, but rather require the designer to sift through a great number of bits of data to find the information the designer is seeking. The designer is confronted with a task analogous to the task a software designer is confronted with in attempting to debug a program by looking at instructions in machine code.

Protocol analyzers have also been used to analyze serial data. However, protocol analyzers available on the market are protocol-specific and currently address only the most widely used communications protocols, including SDLC, Ethernet and FDDI. There are literally thousands of communications protocols currently in use throughout the world for which protocol analyzers have not been developed. Also, existing protocol analyzers do not provide the functionality of time correlating events in one processor of a system with events occurring in another processor of the system, and/or with events occurring on the system communications channel.

Accordingly, a need exists for a general purpose serial data analyzer which is capable of being implemented with a plurality of protocols, which presents data to the user in a format which is convenient and easy to view, and which allows events occurring in different components of a system to be correlated in time.

SUMMARY OF THE INVENTION

The present invention provides a method and apparatus for analyzing serial data. The apparatus of the present invention comprises a serial analyzer tool which receives serial data from a logic analyzer tool. The serial analyzer then processes the serial data to convert the serial data into parallel words. A listing tool receives the parallel words from the serial analyzer tool and generates a listing to be displayed on a display device. The listing generated by the listing tool arranges the parallel words in a first column and the sampled serial data in a second column so that a user is capable of simultaneously viewing at least one of the parallel words and the serial data corresponding to the parallel word when the listing is displayed on the display device. The listing tool also receives a time and state at which each bit of serial data was captured by the logic analyzer. The listing tool arranges the time of each bit of serial data in a third column and the listing arranges the state at which each bit of serial data occurred in a fourth column. Therefore, the user is able to simultaneously view on the display the parallel words, the sampled serial data corresponding to the parallel words, the time at which each bit of the serial data was captured by the logic analyzer, and the states corresponding to each bit in the serial data.

The serial analysis apparatus of the present invention comprises a user interface which presents the user with several windows from which the user makes appropriate selections to configure the logic analyzer tool, the serial analyzer tool and the listing tool. Once these tools have been configured, the serial analysis can begin. The logic analyzer tool captures and samples the incoming serial data. The sampled serial data is then provided to the serial analyzer tool which processes the serial data to convert the data into parallel words. The parallel words and the sampled serial data are then provided to the listing tool which generates the listing referred to above which is then displayed on the display device. The information is presented to the user in a convenient and easy-to-read format.

The serial analysis apparatus of the present invention is capable of analyzing clocked or unclocked data. Also, when analyzing unclocked data, the serial analyzer tool preferably utilizes a software routine for sampling the data to perform clock recovery which eliminates the need for special hardware in the logic analyzer tool. Generally, the routine utilizes a bit clock maintained in software to determine when to sample the data. The routine detects the rising and falling edges in the serial data signal and calculates when a sample should be taken based on the occurrence of these edges. By using the logic analyzer internal clock and by maintaining the bit clock in software in the software analyzer tool, the apparatus is not limited to only analyzing data having data rates which are equal to or a multiple of the clock of the serial analysis apparatus of the present invention. Thus, the serial analysis apparatus of the present invention is a general purpose serial analyzer in that it can be used to analyze serial data encoded in accordance with a plurality of different communications protocols.

The serial analysis apparatus of the present invention can also be used to time correlate events occurring on a serial communications channel with events occurring in one or more devices communicating over the serial communications channel, such as one or more microprocessors. A logic analyzer is used for each device and for the serial communications channel. The output of the logic analyzer connected to the serial communications channel is input to the serial analyzer tool of the present invention. The output of the serial analyzer tool is then input to the listing tool. In contrast, the output of the logic analyzers connected to the devices communicating over the communications channel is input directly to the listing tool. The listing tool then generates a listing for each device and for the communications channel which can all be output to the same display or to different displays. The user can then simultaneously view events occurring in the devices and on the communications channels. Markers can be used to mark times, states, or patterns on the listing from the serial analyzer tool and corresponding markers will automatically appear in the listings for the devices. The windows will also automatically be centered so that the markers in all of the listings can be viewed on the display simultaneously. These markers allow the user to easily time correlate events in the devices and on the communications channel.

Other features and advantages of the present invention will become apparent from the following description, drawings and claims.

BRIEF DESCRIPTION OF THE DRAWINGS

FIGS. 10A and 10B illustration of a plurality of listings generated by the serial analysis apparatus of the present invention in accordance with the embodiment shown in FIG. 9 which are displayed to the user to allow the user to simultaneously view and correlate events occurring on a serial communications channel and in a microprocessor communicating over the communications channel.

DETAILTED DESCRITPION OF THE INVENTION

Generally, the serial analysis apparatus of the present invention is a tool which captures serial data, converts the serial data into parallel words in a format which is familiar and convenient to the user, and displays the formatted data to the user. In accordance with the present invention, any word-width for the parallel words may be selected by the user via a user interface. The user may also select the format that the words are to be displayed in via the user interface such as, for example, binary, octal, hexadecimal, decimal, or ASCII. The user interface displays a workspace window to the user from which the user makes the appropriate selections. As the user makes selections in the workspace window, menus are displayed to the user from which the user makes selections and inputs data to configure and run the serial analysis apparatus of the present invention to analyze serial data.

Figure 1:
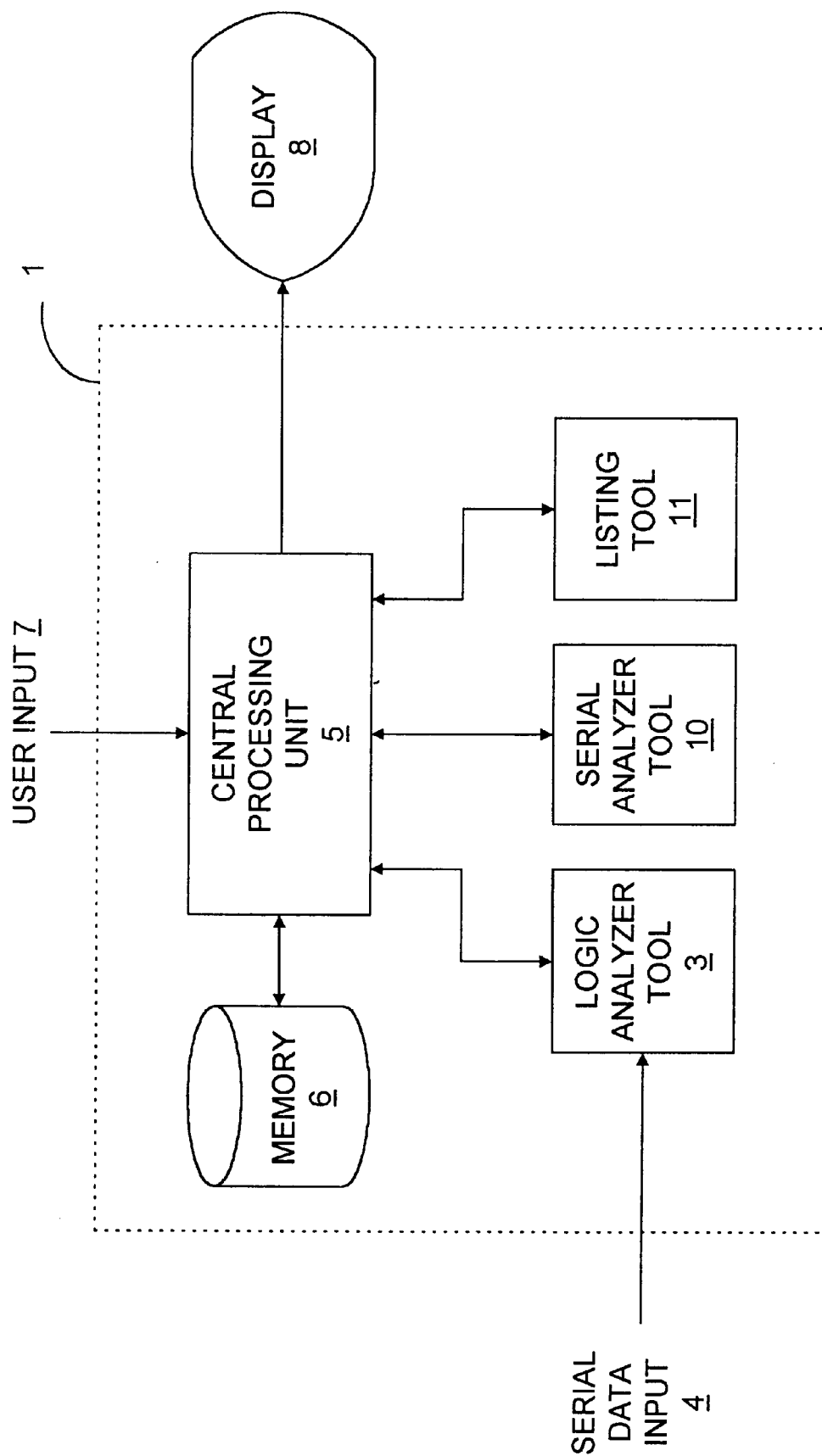
FIG. 1 is a block diagram functionally illustrating the serial analysis apparatus of the present invention.

FIG. 1 is a functional block diagram illustrating the serial analysis apparatus 1 of the present invention. The serial analysis apparatus 1 comprises a central processing unit 5, a memory device 6, a logic analyzer tool 3, and a serial analyzer tool 10, and a listing tool 11. The logic analyzer tool 3 preferably utilizes a combination of hardware and software for capturing serial data 4 and sampling the serial data 4. The output of the logic analyzer apparatus is then provided to the listing tool 11, as discussed in more detail below with respect to FIG. 5. The software routine which controls the sampling of the data by the logic analyzer tool 3 is discussed in detail below with respect to FIGS. 7 and 8. Generally, the software routine maintains an internal bit clock which is synchronized and re-synchronized to the rising and falling edges of the input serial data signal. The memory device 6 is utilized for storing the software routines used by the serial analysis apparatus 1.

The hardware of the logic analyzer tool 3 generally includes circuitry for acquiring the serial data, a storage element for storing the captured data along with respective time tags, and circuitry for conditioning the received data signals for sending them to the CPU 5. In the interest of brevity, a detailed discussion of logic analyzer tool 3 will not be provided herein because such a discussion is unnecessary to provide an understanding of the present invention. It will be understood by those skilled in the art that a logic analyzer tool which is suitable for use with the present invention can be implemented in a variety of ways for capturing and sampling serial data. It will be understood by those skilled in the art the manner in which a suitable logic analyzer tool may be constructed for use with the serial analysis apparatus of the present invention.

The central processing unit 5 configures the logic analyzer tool 3 in accordance with input 7 received from a user who enters selections via an input device such as a keyboard and/or mouse (not shown). The user is presented with menus on display 8 from which the user makes appropriate selections to configure the logic analyzer tool 3, as discussed in more detail below with respect to FIGS. 2–6. The serial analyzer tool 10 converts the sampled data obtained by the logic analyzer tool 3 into parallel words. The converted data is then utilized by the listing tool 11 to generate a listing display. The listing tool 11 receives the output from the logic analyzer tool 3 and the serial analyzer tool 10 and arranges all of the data into a display format which is easy and convenient for the user to view and analyze. The CPU 5 then causes the data to be displayed on display 8.

In accordance with the preferred embodiment of the present invention, the listing tool 11 and the serial analysis tool 10 are both implemented in software which is executed by the CPU 5. Therefore, although these components are shown as being separate from the CPU 5, this is merely for the purposes of illustration. As stated above, the logic analyzer tool 3 preferably is implemented in both hardware and software. Therefore, the software component of the logic analyzer tool 3 is executed by CPU 5 while the hardware components of the logic analyzer tool 3 are implemented external to the CPU 5. However, it will be understood by those skilled in the art that the present invention is not limited with respect to the manner in which the components of the serial analysis apparatus 1 are implemented. It is preferred that the serial analysis apparatus 1 be implemented to a large extent in software rather than hardware because by doing so, the need for special hardware circuitry in the logic analyzer tool 3 for capturing and sampling the serial data is eliminated. One reason for implementing the serial analyzer tool 10 in software is that it is less expensive in that it eliminates the need for front end hardware. Furthermore, by implementing a bit clock in software for sampling unclocked serial data, the need for a separate clock in the logic analyzer tool 3 for performing clock recovery is eliminated and the serial analysis apparatus 1 is made more flexible in that it is not limited to use only with particular data rates.

Figure 2:
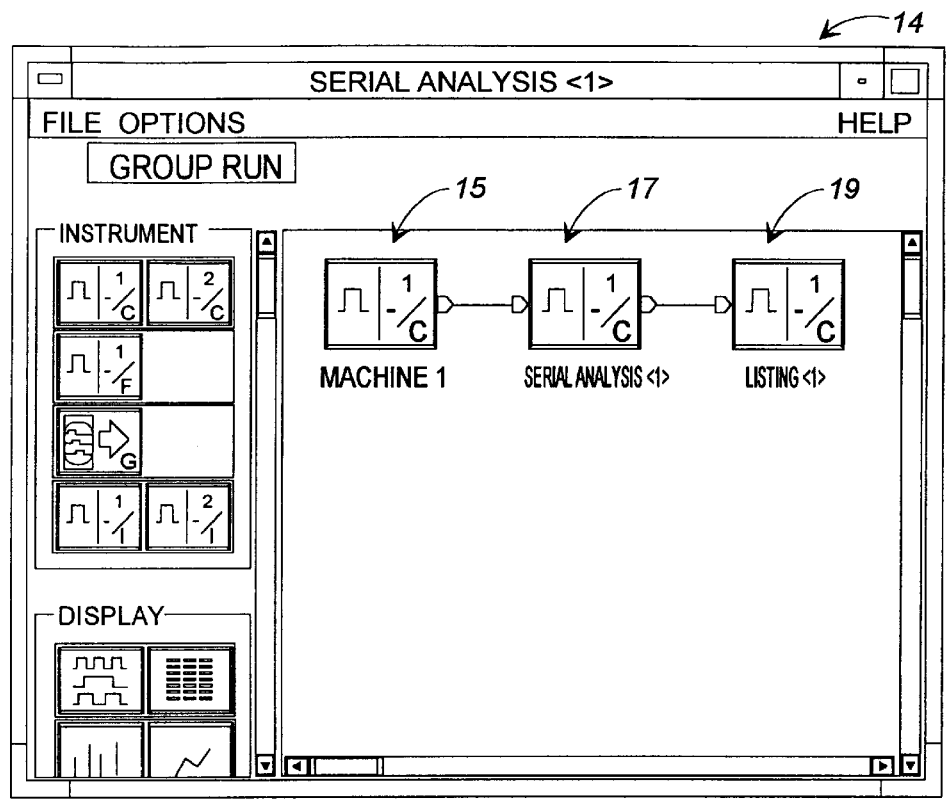
FIG. 2 is an illustration of a workspace menu displayed to the user by the serial analysis apparatus of FIG. 1.

FIG. 2 is an illustration of the workspace window 14 displayed on display 8 from which the user initiates a serial analysis of incoming serial data 4. The Machine icon 15 corresponds to the logic analyzer tool 3 which captures and samples a serial data stream input into the logic analyzer tool 3. In accordance with the preferred embodiment of the present invention, a second logic analyzer tool (not shown) can be connected in parallel with the logic analyzer tool 3 and the data captured and sampled simultaneously by each logic analyzer tool can be converted simultaneously. The Machine icon 15 allows the user to specify which of these logic analyzer tools is being configured and to make selections to configure the logic analyzer tool. The Serial Analysis icon 17 corresponds to the serial analyzer tool 10 which converts the serial data into parallel words of a selected length and formats the words in accordance with certain selections made by the user. The Listing icon 19, which corresponds to the listing tool 11, receives the both the captured data from the logic analyzer tool 3 as well as the converted and formatted data from the serial analyzer tool 10.

In order to analyze serial data, the user must configure the logic analyzer tool 3, the serial analyzer tool 10, and the listing tool 11. In order to configure the logic analyzer tool 3 and the serial analyzer tool 10, the user first selects which of the two logic analyzer tools is to be configured and then configures the selected logic analyzer tool. Configuring the logic analyzer tool includes specifying the trigger condition as well as selecting the sample rate. The user then selects the Serial Analysis icon 17 shown in FIG. 2. Once the user has made this selection, the Serial Analysis Main Menu 18 shown in FIG. 3 will be displayed to the user on display 8. The user then inputs the appropriate information in the appropriate fields in the menu in order to configure the serial analyzer tool 10.

The "Select bit" field 21 shown in the Serial Analysis Main Menu allows the user to select one of the bits in the input data when the input data is wider than one bit. The "Invert input data" field 23 inverts the input data when selected. This may be used when the data captured by the logic analyzer tool 3 is inverted, such as with RS-232 data, for example. The "Label" field 24 allows the user to select the name of the column shown in the display 8 which is to represent the column of parallel words corresponding to the converted serial data. The "Word width" field 25 allows the user to select the width of the parallel words to be displayed on display 8. The "Start on state" field 27 allows the user to specify the state number on which the conversion of the input serial data from serial to parallel will begin. The "Bit order" field 31 allows the user to specify whether the data being captured by the logic analyzer tool 3 is in the order of most significant bit first or least significant bit first. The "Extract frame data" field 32 allows the user to designate start and end patterns in the serial data which are to indicate the beginning and ending points in the serial data stream for converting the data. This feature allows the user to view selected data within a frame.

The "Define" frame button 35 causes the Define Frame Menu 41 shown in FIG. 4 to be displayed, as discussed in detail below. The "Define" clock recovery button 37 enables acquisition and sampling of serial data that does not have a clock. This button causes the Clock Recovery Menu shown in FIG. 5 to be displayed, as described in more detail below. The "Execute serial analysis" button 39 causes the output data from the serial analysis process to reflect changes in the menu. The "Run" button 41 causes the serial analysis process to begin.

Figure 4:
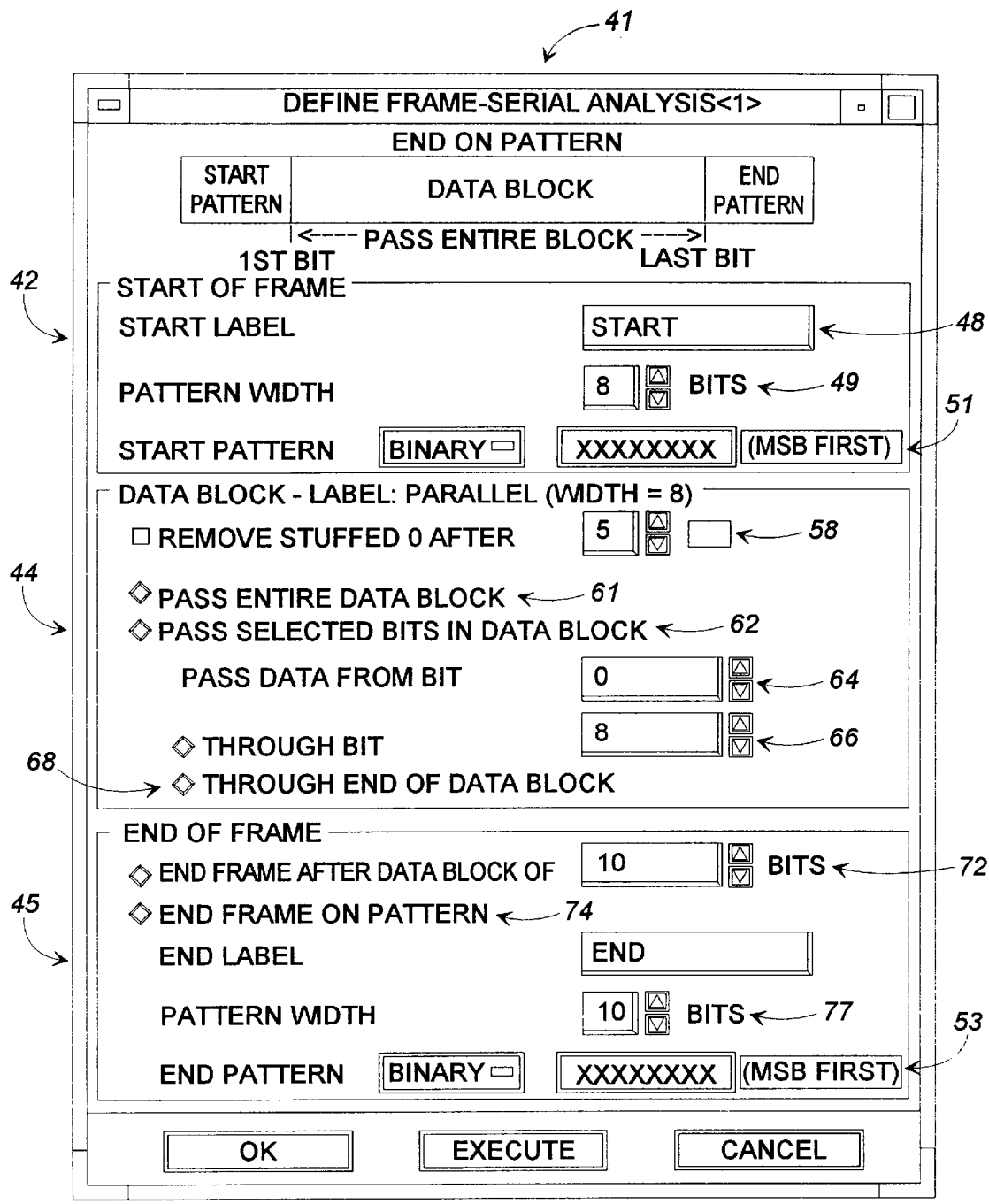
FIG. 4 is an illustration of a menu presented to the user via the user interface of the serial analysis apparatus of the present invention upon making a selection from the menu shown in FIG. 3.

When the user selects the "Define" frame button 35 in the Serial Analysis Main Menu 18, the Define Frame Menu 41 shown in FIG. 4 is displayed. This menu allows the user to designate frames of serial data to be converted into parallel words. The serial data to be converted can be designated in a number of ways, such as by designating start and end patterns contained in the serial data, by designating blocks of data to be converted, or by designating particular bits within a block of data to be converted. This feature of the present invention allows the user to view only the data that is of interest to the user.

The Define Frame Menu 41 shown in FIG. 4 comprises three sections, namely, the "Start of frame" section 42, the "Data block" section 44, and the "End of frame" section 45. In the "Start of frame" section 42, the "Start label" field 48 is used to identify the name to be assigned to the start pattern. Whatever label the user selects will be displayed in the Listing Menu, as discussed in more detail below with respect to FIG. 5. The "Pattern width" field 49 is used to select the width of the start pattern, i.e., the number of bits contained in the start pattern. In the example shown in FIG. 4 the bit pattern is selected to be eight bits wide. The "Start pattern" field 51 is used to assign the start pattern and an option is provided for allowing the user to select whether the start pattern is displayed in binary, hex or octal. Typically, the start pattern will mark the beginning of a frame of data that the user is interested in viewing or analyzing. It should also be noted that "dont cares" may be included in the start pattern so that if the pattern the user is looking contains certain bits that the user wants to ignore, the serial analyzer tool will detect the pattern of bits specified and ignore the bits in the dont care positions. The "End patten" field 53 is used to assign the bit pattern which corresponds to the point at which the data conversion is to stop. For example, if the user wants to view the data starting with binary address 0 and ending with binary address 32, the user will designate the starting bit pattern as 00000000 (binary 0) and the end frame bit pattern as 00110010 (binary 32). The serial analyzer tool 10 will then convert only the data between these addresses.

In the "Data block" section 44 of the Define Frame Menu 41, the "Remove stuffed 0" field 58 is used for frames of data containing stuffed bits. Some communications standards use stuffed bits to maintain clock synchronization at the receiving end. If stuffed bits are being used, the user can make the selection to remove them. The "Pass entire data block" field 61 is used to designate whether all of the data between the assigned start and end patterns is to be converted. On the other hand, the "Pass selected bits in data block" field 62 is used to prevent all of the data between the start and end bit patterns from being converted so that only selected data between the start and end patterns is converted. The "Pass data from bit" field 64 and the "Through bit" field 66 are used to indicate starting point and ending points, respectively, of the data to be converted. The "Through end of data block" field 68 is used to indicate that all the data from the start bit through the end of the data block is to be converted.

The "End of frame" section 45 of the Define Frame Menu 41 is used to designate the point in the data where the serial analysis process is to end. The user may select the "End frame after data block of" selection 72 and then enter the number of bits contained in the block to indicate that the conversion is to end after a selected number of bits have been converted. On the other hand, the user may select the "End frame on pattern" 74 to indicate that the conversion is to end once the end pattern has been detected. The "Pattern width" field 77 is used to indicate the number of bits in the end pattern. As with the start pattern, the user has the option of choosing whether the end pattern is displayed in binary, hex, or octal.

Figure 5:
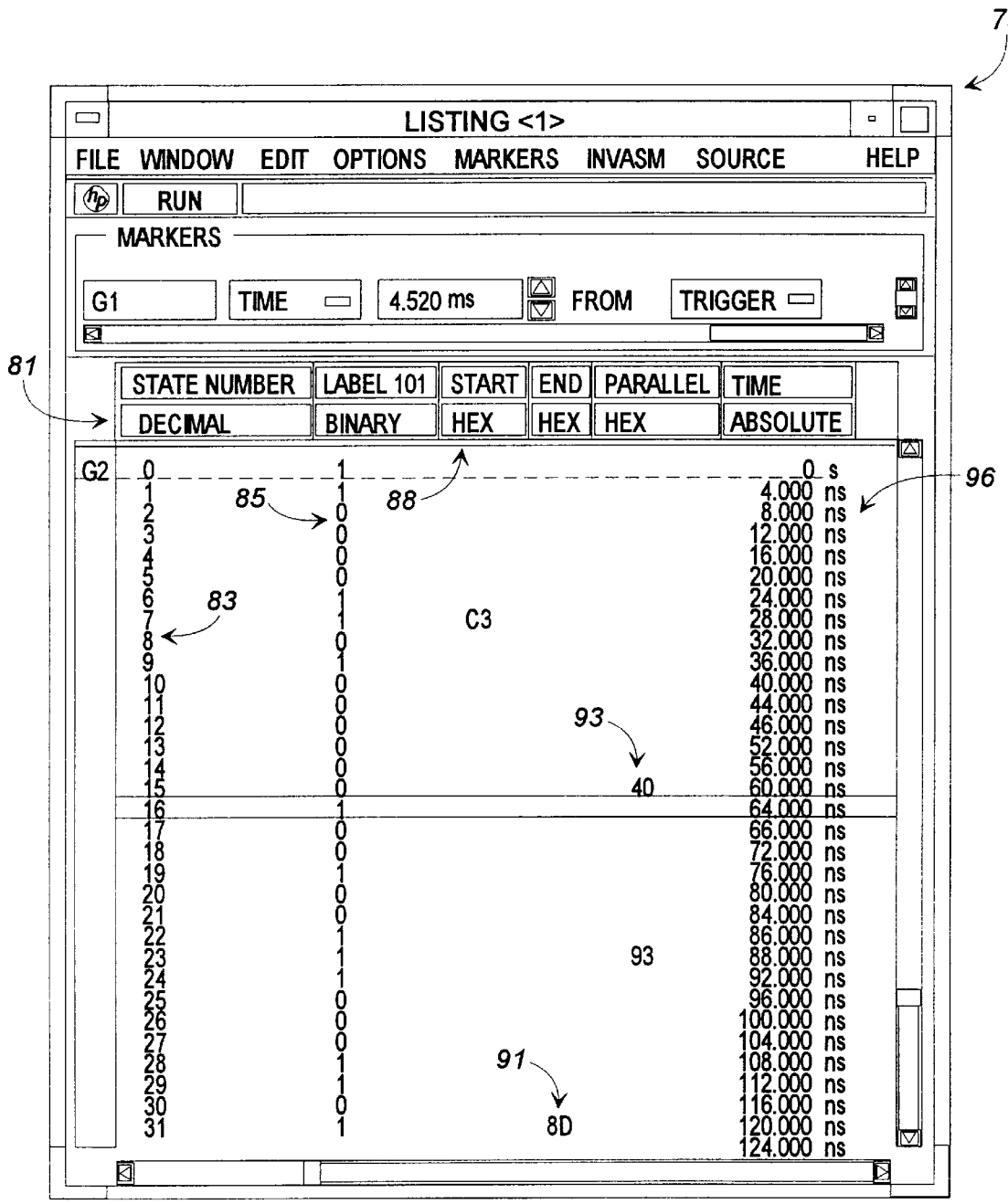
FIG. 5 is an illustration of a listing generated by the listing tool illustrated in FIG. 1 which is displayed to the user to allow the user to view and analyze the data.

FIG. 5 is an example of a Listing Menu 79 generated by the listing tool 11 which shows the format of the data displayed on the display 8 for the user to view and analyze. Looking at the columns from left to right, the far left hand column 81, labeled "State Number", represents the state numbers which correspond to the order and time of the samples relative to the trigger. The state numbers 83 are numbered sequentially so that the user will be able to easily ascertain when a particular sample was taken. The states correspond either to the clock provided with the serial data if the data is clocked or to the internal bit clock of the serial analysis apparatus 1 of the present invention if the data is unclocked and clock recovery is being used. In this example the state numbers are listed in decimal form.

The next column in the menu 85, labeled "label101", corresponds to the sampled serial data in binary. It should be noted that the labels may be selected by the user so that they have a particular meaning with which the user is familiar. The user may also select the format in which the data is displayed, such as binary, hex, octal or ASCII. In this example, the user has selected the format for the sampled data as binary. The next column 88, labeled "Start", corresponds to the start pattern, which was entered by the user in the Define Frame Menu 41, as discussed above with respect to FIG. 4. In this example shown in FIG. 5 the start pattern corresponds to C3 in hexadecimal, as shown in the "Start" column 88. It should be noted that C3 corresponds to the first eight bits listed in the "label101" column 85 in the Listing Menu 79.

The next column 91, labeled "End", corresponds to the end pattern, which was entered by the user in the Define Frame Menu 41, as discussed above with respect to FIG. 4. In this example shown in FIG. 5 the end pattern corresponds to 8D in hexadecimal, as shown in the "End" column toward the bottom of the menu in FIG. 5. It should be noted that 8D corresponds to the last eight bits listed in the "label101" column 85 in the Listing Menu 79.

The next column 93 in the menu 79, labeled "Parallel", corresponds to the parallel words produced by converting the serial data shown in the "label101" column 85 from serial to parallel. In the example shown in FIG. 5, the first word after the start pattern is 40 in hexadecimal. The second eight-bit word after the start pattern is 93 in hexadecimal. It will be noted that in this example, the user made the sections in the Define Frame Menu 41 to have the serial data converted into eight-bit words in hexadecimal. The last column 96 in the Listing Menu, labeled "Time" corresponds to the time, in increments of 4.0 nanoseconds (ns), at which each sample was taken with respect to the trigger. When the logic analyzer tool 3 captures the serial data and stores it in RAM, a time tag is also stored in RAM which corresponds to the time a particular serial data word was stored in RAM relative to the trigger. This column allows the user to easily ascertain when, with respect to the time and state, the parallel words corresponding to the serial data occurred.

Therefore, the Listing Menu 79 of the present invention provides a convenient and easy-to-analyze format of the serial data which allows a user to easily debug digital systems which utilize serial data. The user is provided with menus which allow the user to easily select the data the user wishes to analyze so that data which is not of interest is not displayed to the user whereas the data of interest is emphasized in the format displayed to the user. The advantages of the serial analysis apparatus 1 of the present invention will be readily apparent to those skilled in the art. Further benefits and advantages of the present invention will become apparent from the discussions provided below of the clock recovery and time correlation aspects of the present invention.

Clock recovery is well known in the communications industry and generally corresponds to receiving asynchronous, or unclocked, data and sampling the received data to reconstruct the data. Clock recovery traditionally has been accomplished by implementing special hardware in serial communication receivers and protocol analyzers which are used to capture and sample serial data. One well known clock recovery scheme utilizes a phase locked loop (PLL) to detect the transitions of the data from high to low or from low to high to maintain synchronism with the incoming data. The hardware detects a start bit by using the edges of the serial data signal and then moves to the center of the start bit and begins sampling the data at the data rate.

Another well known method of performing clock recovery, which also requires special hardware, implements a counter which is clocked, or incremented, at a higher speed than the data rate. For example, the counter typically is clocked at a speed of sixteen times the data rate. Thus, when the counter has been incremented to sixteen, a bit will have passed. The clock recovery circuit detects a start bit and then counts to eight, which corresponds to the center of the start bit. The clock recovery circuit then begins sampling the data.

These known clock recovery schemes both require special hardware in the receivers and protocol analyzers for capturing and sampling serial data. In contrast to these known methods, the serial analysis apparatus 1 of the present invention performs clock recovery in software utilizing a method which eliminates the need for a clock having a defined frequency which is the same as, or a multiple of the data rate of the incoming data. Furthermore, the clock recovery method of the present invention can be implemented with a plurality of different data rates and is not limited to any particular data rate. Thus, the clock recovery method of the present invention can be utilized to perform clock recovery for communications protocols of any frequency.

In accordance with the present invention, the bit time, which is the inverse of the bit rate of the serial data, is selected by the user, and can be any value. The user specifies the bit time and the incoming serial data is then sampled in the middle of each bit. An internal bit clock is maintained in software and is synchronized on the rising and/or failing edges of the serial data. The rising and/or failing edges of the serial data are also used to re-synchronize the internal bit clock. The software routine of the serial analyzer tool 10 analyzes the samples taken by the logic analyzer tool 3 to determine where a rising and/or falling edge in the serial data has occurred, i.e., where the data changed from 0 to 1 or from 1 to 0. The software routine then calculates which of the samples taken by the logic analyzer tool 3 are to be kept as a valid sample. The manner in which this is accomplished by the serial analyzer tool 10 is discussed in detail below with respect to FIG. 7.

Figure 6:
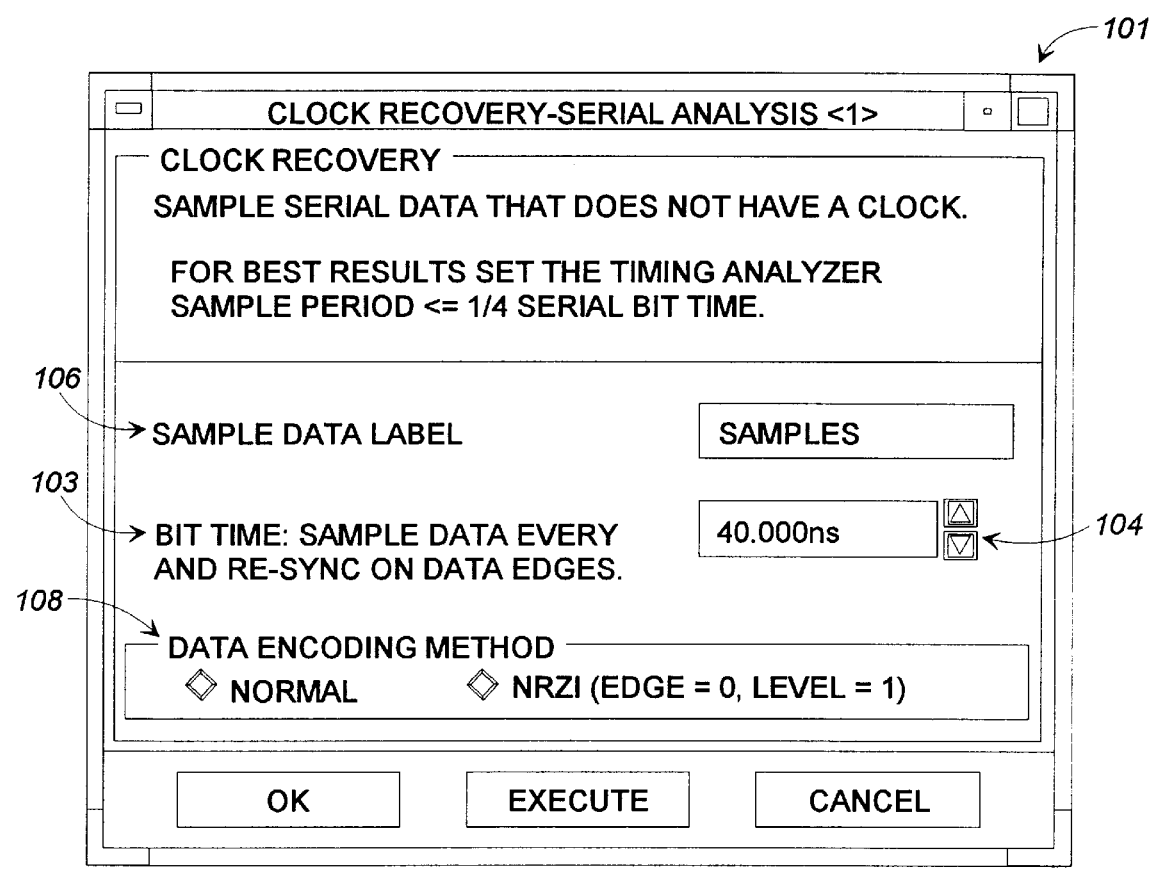
FIG. 6 is an illustration of a menu presented to the user via the user interface of the serial analysis apparatus of the present invention upon making a selection from the menu shown in FIG. 3.

The Clock Recovery menu 101 for configuring the clock recovery software routine to be executed by the serial analyzer tool 10 is shown in FIG. 6. Clock recovery is performed in part by the logic analyzer tool 3 and in part by the serial analyzer tool 10. The logic analyzer tool 3 acquires the serial data and samples the serial data. The serial bits are stored in an acquisition RAM (not shown) in the logic analyzer tool 3 as they are captured. With each bit stored in the acquisition RAM, a corresponding time tag is stored in RAM which indicates the time at which the bit was stored relative to a trigger. Each of these bits is also sampled by the logic analyzer tool 3 a plurality of times, preferably at least 4 times. These samples are also stored in the RAM comprised by the logic analyzer tool 3. The serial analyzer tool 10 then obtains the samples stored in RAM and, in accordance with the software routine of the serial analyzer tool 10 mentioned above, determines which of the samples is to be used as a valid sample. Once the serial analyzer tool 10 has obtained the valid samples, the valid samples, which correspond to the serial data, are converted into parallel words.

Figure 3:
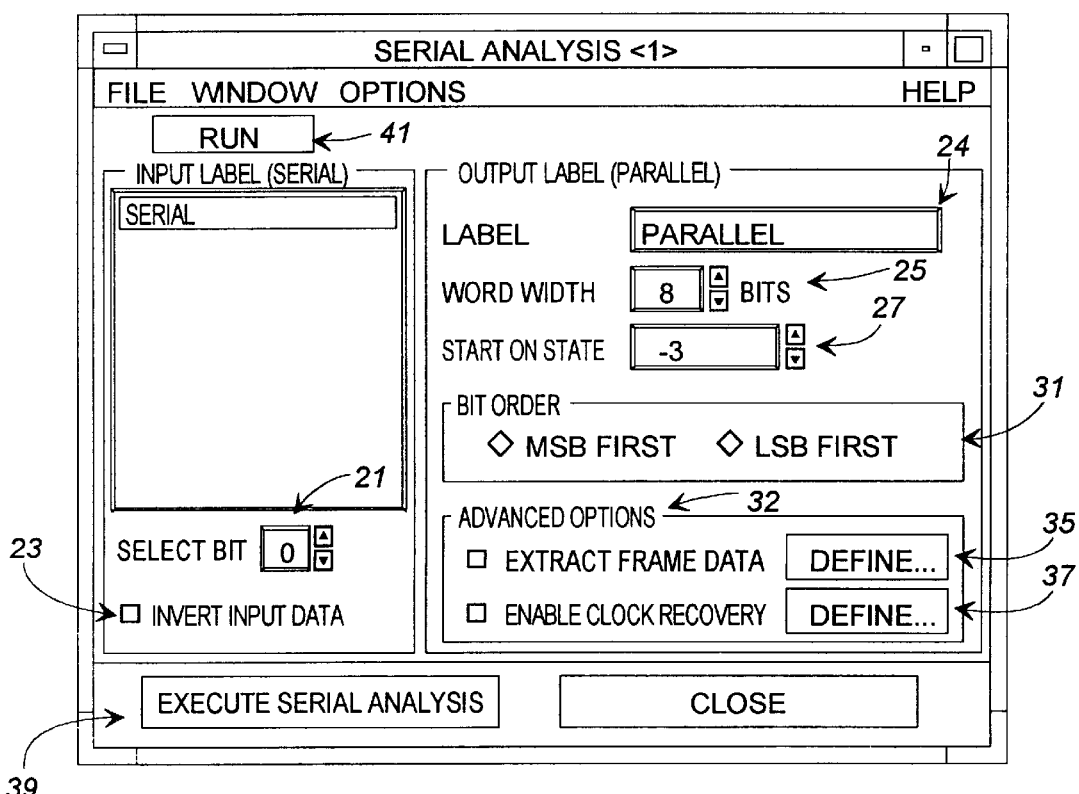
FIG. 3 is an illustration of a menu presented to the user via the user interface of the serial analysis apparatus of the present invention upon making a selection from the menu shown in FIG. 2.

The Clock Recovery menu 101 is displayed when the user selects the "Define" button 37 adjacent the "Enable clock recovery" field illustrated in FIG. 3. Preferably, the sample period is set so that at least 4 points, or samples, are taken by the logic analyzer tool 3 on each serial bit. The user specifies the bit time of the serial data by entering the bit time in box 104 shown next to the "Bit Time" field 103. In order to set the sample period, or the number of times each bit will be sampled, the user enters the sample period when configuring the logic analyzer tool 3 by selecting the "Machine" icon 15 shown in the workspace window of FIG. 2 and entering the sample period in the appropriate box (not shown). The serial data is then sampled by the logic analyzer tool 3 at the sample rate specified. These samples are then used by the serial analyzer tool 10 in the manner discussed above to obtain valid samples which are converted into parallel words.

The "Sampled data label" field 106 shown in FIG. 6 corresponds to the name of the sampled data displayed in the Listing Menu 79. In the example of the Listing Menu 79 shown in FIG. 6, the name of the sampled data is designated as "label101". As stated above, the "Bit time" field 103 specifies the bit time of the serial data. The bit time is 1/(bit rate). The "Data encoding method" field 108 allows the user to specify the type of data encoding method which has been used on the serial data. Normal binary data which is a 1 or a 0 is sampled as 1 or 0. Non-return-to-zero-inverted (NRZI) data is a 0 if an edge just occurred and a 1 if the data hasn't changed over a period.

Figure 7:
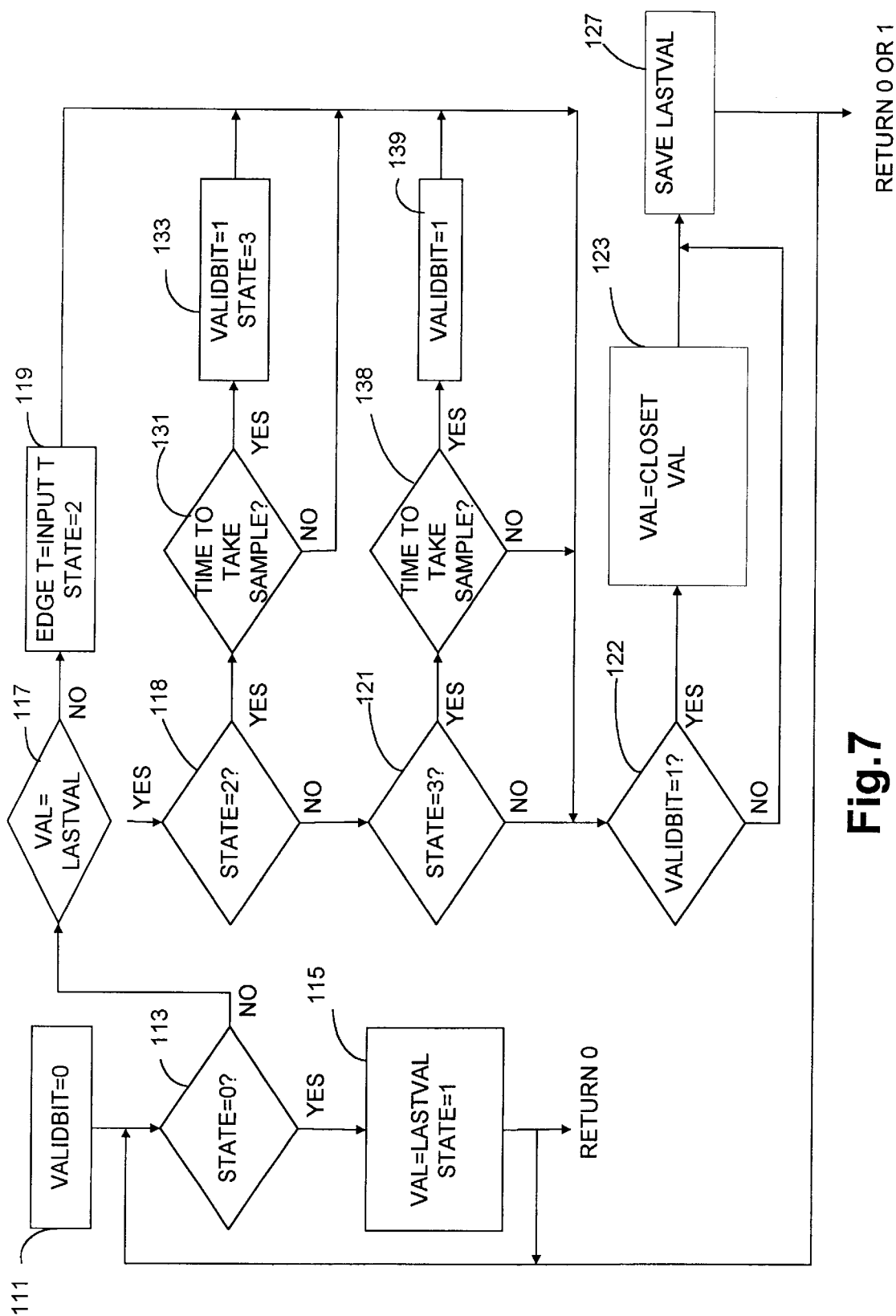
FIG. 7 is a flow chart functionally illustrating the clock recovery routine performed by the logic analyzer tool illustrated in FIG. 1.

FIG. 7 is a flow chart demonstrating the clock recovery software routine performed by the serial analyzer tool 10 in accordance with an exemplary embodiment. As stated above, this routine analyzes the serial data captured by the logic analyzer tool 3 to determine when to sample a bit in the serial data and then takes the sample which occurred closest to the middle of the bit. When VALIDBIT equals 1, the routine returns a 1 to the serial analyzer tool 10 and the serial analyzer tool 10 then selects the current sample as the sample to represent the data bit. If the routine exits with the value of VALIDBIT being 0, the serial analyzer tool 10 does not select the sample.

In step 111, VALIDBIT is initialized to 0. The process then proceeds to step 113 where a determination is made as to whether the routine state is at state 0. There are four states in the routine, namely, state 0, which corresponds to the first time through the routine, state 1, which corresponds to the state where the routine is still looking for the first edge in the data to occur, state 2, which becomes the state upon detecting an edge, and state 3 which corresponds to looking for samples after the first edge has occurred.

If the state is 0 at step 113, the process proceeds to step 115 where the current bit value, VAL, is assigned the value of the last bit, LASTVAL, and the state is assigned a value of 1. The routine returns a 0 to the serial analyzer tool 10 and exits the routine. The main routine then grabs the next value, VAL and returns to step 113 where it is determined whether the state value is 0. Since the state was assigned a value of 1 in step 115, state will not be equal to 0 and the process will proceed to step 117 where a determination is made as to whether VAL=LASTVAL. This step checks to see if a rising or falling edge has occurred in the data. If VAL=LASTVAL, meaning that an edge has not occurred, the process proceeds to step 118 where it is determined whether state=2. Since state=1 at this point, the process will go to step 121 to check whether the state=3. Since the state=1, the process then will skip step 121 and proceed to step 122 where a determination is made as to whether VALIDBIT=1. At this point, VALIDBIT cannot equal 1 because VALIDBIT can only be 1 after an edge has occurred because a sample cannot be taken until an edge has occurred. Therefore, the process will proceed to step 127. At step 127, whatever the last value of the data was is then saved as LASTVAL to be used by the routine the next time through. A zero is then returned to the serial analyzer tool 10 and the process returns to step 113.

If it is determined at step 117 that VAL is not equal LASTVAL, indicating that an edge has occurred, the process proceeds to step 119 where the time since the last edge occurred, EDGE T, is set equal to the time of the current time, INPUT T. The process state is then assigned a value of 2. The process then proceeds to step 122 where a determination is made as to whether VALIDBIT=1. VALIDBIT will not equal 1 at this point because the routine has just entered state 2 and VALIDBIT=1 will only occur after a certain amount of time that has elapsed since the last edge occurred. The process then proceeds to step 127 where the last value of the sample is saved as LASTVAL for use the next through the routine. A zero is returned to the serial analyzer tool 10 and the process returns to step 113.

When the process returns to step 113, the process state will either be 1 or 2, depending on what occurred at steps 113, 117, and 122. Therefore, the process will proceed to step 117. Assuming that the state is 2 indicating that a first edge has already occurred, the routine will be looking for a first sample after the first edge. Therefore, at step 117, VAL will equal LASTVAL because an edge has just occurred and the process will proceed to step 118 where a determination is made as to whether the state is 2. Since the state is 2 at this point, the routine will proceed to step 131 where a determination is made as to whether it is time to take a sample. When determining whether it is time to take a sample during state 2, the routine determines whether the input time of the current sample minus the amount of time that has elapsed since the last edge occurred minus half the bit time, is greater than or equal to 0. Generally, this calculation determines whether the sample corresponds to the middle of the data bit. If not, the routine will remain in state 2, return a 0 to the serial analyzer tool 10, and go through the routine once again until it reaches step 118. From step 118, the routine will proceed to step 131 where a calculation is once again made to determine whether the sample corresponds to the center of the data bit. If so, the current sample should be used as the representative sample. Therefore, VALIDBIT is assigned a 1 at step 133 and the state is set to 3. Thus, the routine remains in state 2 until a first sample has been taken and then it will immediately enter state 3.

The process then proceeds to step 122. Since VALIDBIT now equals 1, the process proceeds to step 123. At step 123, the process determines whether the last sample or the current sample is closer to the center of the bit. If the last sample is closer, the current value is set to the last value. If the current value is closer, the process proceeds directly step 127, which is discussed above. Now the state is 3. In state 3 the routine is looking for a second sample after the edge. In state 3 the samples are taken at intervals of a bit time. This time is twice as long as the amount of time which elapses from the occurrence of an edge in state 2 and the taking of a sample at step 131. Therefore, in state 3, the next sample taken after the first sample was taken in state 2 is approximately one bit period apart from the taking of the sample in state 2 and occurs in the center of the second bit after the occurrence of the edge.

After entering state 3 and proceeding through steps 122, 123 and 127, the process returns to step 113. Since the state is 3 and a second edge has not yet occurred, the process proceeds to step 121 and then to step 138 where the routine determines whether it is time to take a sample. In order to make this determination in state 3, the routine calculates the input time of the sample minus the ideal time at which the last sample should have been taken minus the bit time and determines whether that amount is greater than or equal to 0. As stated above this amount generally will be approximately one bit period from the time that the very first sample was taken at step 131. However, in order to ensure accurate sampling, the routine utilizes the ideal time at which the last sample should have been taken in the calculation.

When it is time to take a sample, the process proceeds to step 139 and VALIDBIT is assigned a 1. The process proceeds to steps 122, 123 and 127. After step 127, the process returns to step 113. It should be noted that the routine remains in state 3 and continues repeatedly returning to block 138 and taking samples at the appropriate time until another edge is detected at step 117, which will cause the routine to re-enter state 2 at step 119. The output of the routine is always a 1 or a 0. VAL and LASTVAL are two variables that are global to the clock recovery routing and the main routine. As stated above, when the serial analyzer tool 10 receives a 1 it will use the corresponding sample, VAL, as the sample representing the data bit. It should also be noted that the routine shown in FIG. 7 will be executed a plurality of times for each serial data bit in order to obtain one sample to represent the serial data bit. Thus, if the user desires to sample the data at four times the data rate, this routine will be performed several times for each data bit, with one representative sample being selected by the serial analyzer tool 10 to represent each data bit.

It should be noted that the clock recovery routine demonstrated by FIG. 7 is merely an example of the manner in which clock recovery can be accomplished using an internal bit clock maintained in software. It will also be apparent to those skilled in the art that the manner in which the routine calculates when it is time to take a sample, as illustrated in blocks 131 and 138, can be accomplished in a plurality of ways.

Figure 8:
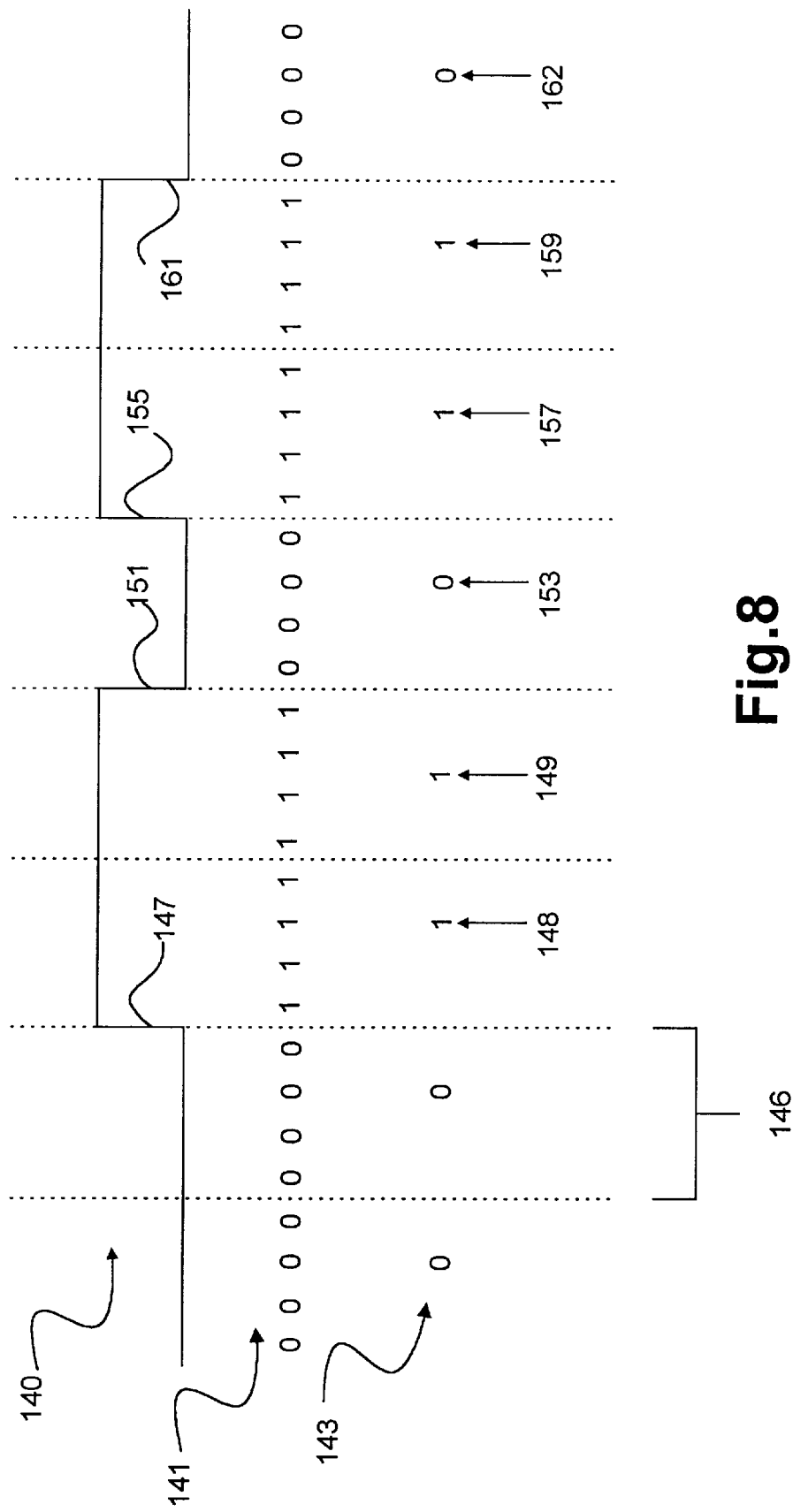
FIG. 8 is a timing diagram illustrating the timing of the clock recovery routine illustrated by the flow chart of FIG. 7.

FIG. 8 is a timing diagram illustrating a timing waveform 140 which corresponds to the data received by the logic analyzer tool 3, a series of 1s and 0s which corresponds to the waveform 140 as sampled by the logic analyzer tool 3 at four times the bit rate of the data stream. The bits 143 are the sampled bits selected by the serial analyzer tool 10 in accordance with the clock recovery software routine of FIG. 7. The dashed lines are intended to illustrate the bit period 146 of the serial data.

Looking at the timing diagram, on the first rising edge of the data signal 147, the state in the clock recovery routine of FIG. 7 will change from state 1 to state 2. Therefore, the first sample taken 148 during the first bit period after the signal goes high will be taken during state 2. This sample will be taken at approximately half of the bit period after the signal goes high such that it is taken in approximately the center of the bit. The state then changes from state 2 to state 3, as discussed above with respect to FIG. 7. The second sample taken 149 after the rising edge 147 will be taken during state 3. This second sample is taken at approximately one whole bit period after sample 148 was taken so that the sample is taken in the center of the bit. The data signal then goes low, as indicated by falling edge 151. This causes the clock recovery routine to re-enter state 2. The first sample 153 taken after the routine re-enters state 2 is taken at approximately one half of the bit period, as discussed above. The routine then enters state 3. The data signal then goes high again, as indicated by rising edge 155, thereby causing the routine to return to state 2. Therefore, the next sample taken 157 is taken in state 2 and is taken at approximately one half of the bit period so that it is taken in the center of the bit. The state then changes from state 2 to state 3 and sample 159 is taken in state 3 at approximately one whole bit period from the time sample 157 was taken. The data signal 140 then goes low, as indicated by falling edge 161, thereby causing the routine to re-enter state 2. Sample 162 is then taken in state 2.

The timing at which the samples are taken in state 2 is calculated by the clock recovery routine based on the time at which the data signal transitioned from one state to another. The timing at which the samples are taken in state 3 is calculated by the clock recovery routine based on the ideal time at which the last sample was taken which is based on the time at which the last edge occurred. Therefore, the taking of samples in states 2 and 3 by the serial analyzer tool 10 of the present invention is constantly synchronized with the rising and falling edges of the data signal so that the occurrence of errors as a result of sampling is minimized.

Another important feature of the present invention is time correlation. Time correlation generally allows events occurring in one device to be correlated in time with events occurring in another device. Although it is generally known to perform time correlation in certain instances, it is not known to utilize time correlation to correlate serial data on a serial communications channel. In accordance with the present invention, the serial analyzer apparatus 1 allows events occurring on a serial communications channel of a system to be time correlated with events occurring in another component of the system, such as in a microprocessor.

Figure 9:
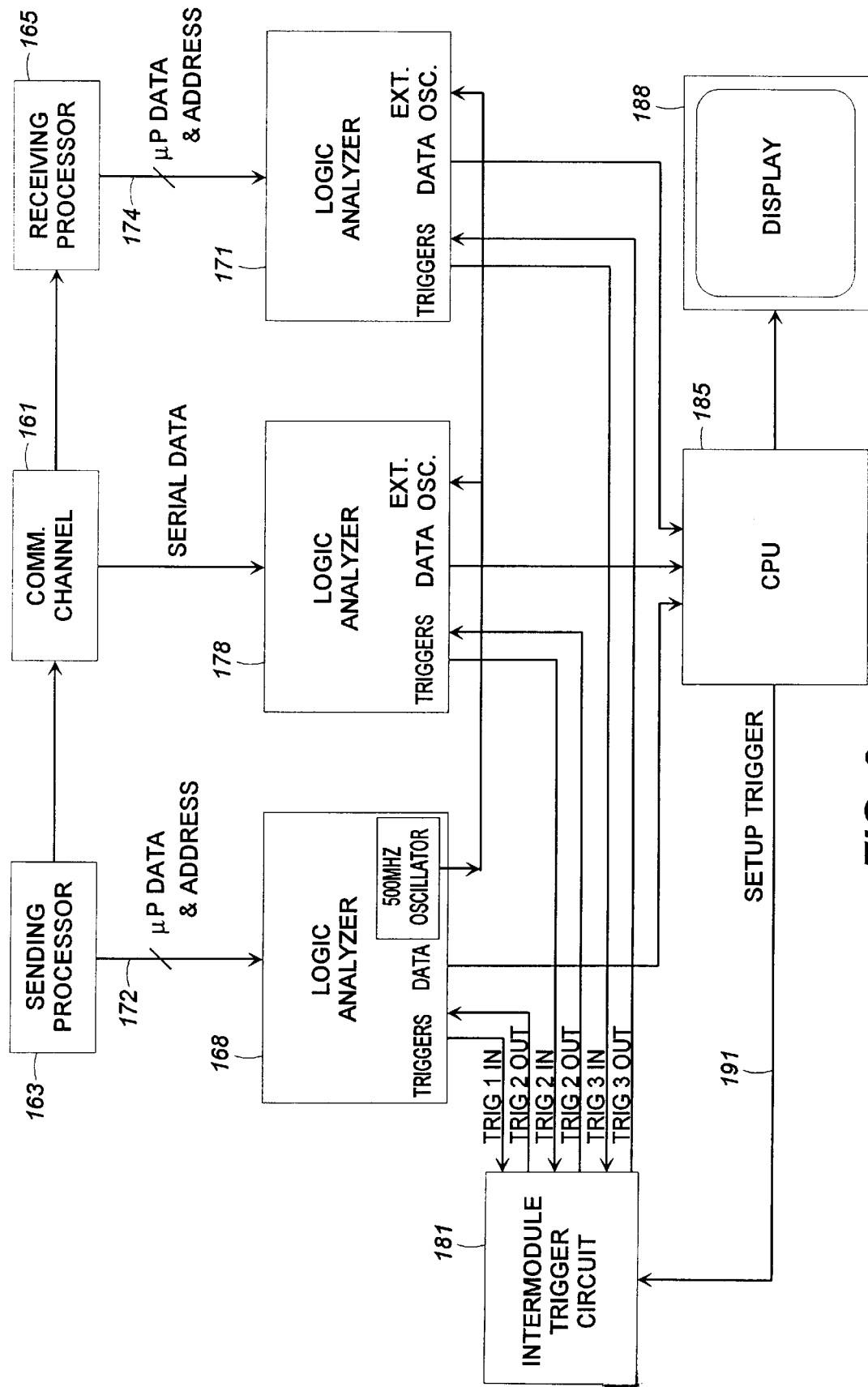
FIG. 9 is a functional block diagram illustrating one embodiment in which the method and apparatus of the present invention is used to perform time correlation.

Many systems have several microprocessors which communicate with each other and with other system components via a serial communications channel. The present invention allows a user to time correlate data on the serial communications bus with instructions being executed in one or more microprocessors in real time so that events and/or problems occurring within a system can be observed. Furthermore, the serial analyzer apparatus 1 allows the user to display listings which correspond to each of the components being time correlated on a single display. Alternatively, the listings can be displayed separately on different displays. FIG. 9 illustrates such an implementation of the present invention. FIG. 9 illustrates a serial communications channel 161 which is in communication with a sending microprocessor 163 and a receiving microprocessor 165. The microprocessors 163 and 165 are connected to logic analyzers 168 and 171, respectively, via address/data buses 172 and 174, respectively. Buses 172 and 174 each have a plurality of lines for sending data in parallel to the logic analyzers 163 and 165.

A third logic analyzer 178 is connected to the serial communications channel 161.

Each of the logic analyzers 168, 171 and 178 is connected to an intermodule trigger circuit 181 via a trigger-in pin and a trigger-out pin. Logic analyzers 171 and 178 are chained to the clock of logic analyzer 168, which is a 500 MHz clock in the example shown. Each of the logic analyzers 168, 171 and 178 is also connected to a CPU 185 which is connected to a display 188. The CPU 185 is also connected to the intermodule trigger circuit 181 via a setup-trigger line 191. In operation, during configuration of the logic analyzers, the user selects which logic analyzer is to provide the trigger for the other logic analyzers so that all of the logic analyzers trigger from a common trigger. By causing all of the logic analyzers to trigger from a common trigger and by chaining the clocks together, the time stamps stored in the acquisition RAMs (not shown) of the logic analyzers when the data is captured and stored in the RAMs will correspond. It should also be noted that rather than using a common trigger, the user can setup the logic analyzers such that when one logic analyzer triggers, the others trigger, with each utilizing its own trigger.

For example, the user may configure logic analyzers 178 and 171 to use the trigger of logic analyzer 168. The CPU 185 will then cause the intermodule trigger circuit to take the trigger-in input from logic analyzer 168 and to provide the trigger of logic analyzer 168 to the logic analyzers 171 and 178 via their respective trigger-out lines from the intermodule trigger circuit 181. Thus, all of the logic analyzers will be using the same trigger. The data captured from each of the logic analyzers will then be provided to CPU 185. With respect to logic analyzer 178, which is connected to the serial communications channel, the CPU 185 will execute the serial analyzer tool 10 and then the listing tool 11 discussed above with respect to FIG. 1. However, with respect to logic analyzers 168 and 171, the CPU 185 will only execute the listing tool 11 because no serial data is being processed.

Figure 10A:
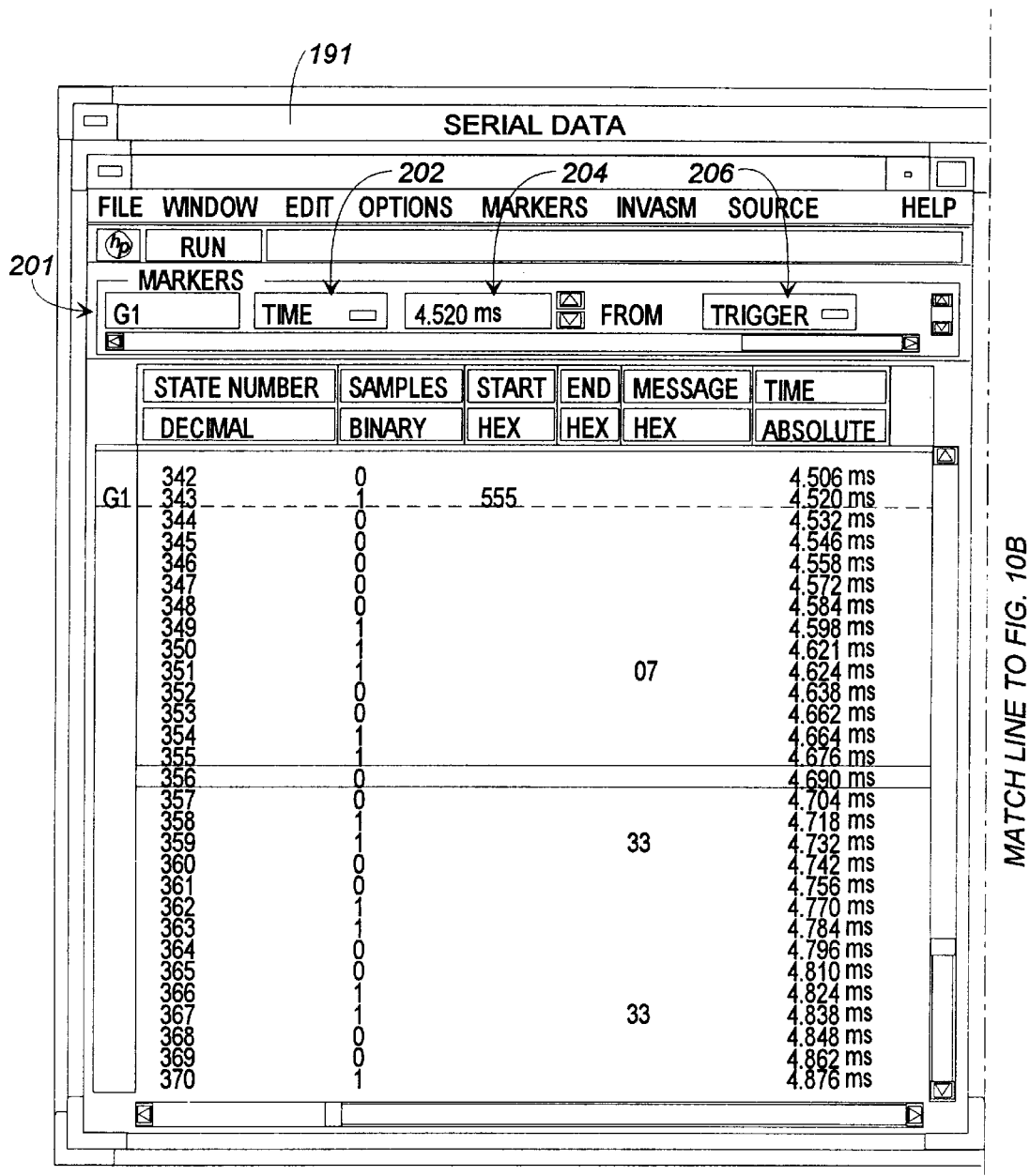

FIGS. 10A and 10B together illustrate an example of listings displayed on display 188 for the receiving microprocessor 165 and for the serial communications channel. As stated above, the listing tool can cause these listings to be displayed in one window adjacent one another for easy viewing by the user. Alternatively, the output of the CPU 185 for each of the listings could be sent to separate displays. Listing 191 corresponds to the serial communications channel and listing 193 corresponds to microprocessor 165. In accordance with the present invention, the information in the listings can be time correlated with respect to time, state or a specified pattern. If, for example, the user desires to correlate the listings with respect to the time at which the samples are stored in the acquisition RAMs of the logic analyzers, the user will configure listing 191. This is accomplished by selecting the marker button 201, selecting the option of "time" with button 202. With button 202, other options can be made such as "state" or "pattern". The user then enters the time to be marked in box 204 and then selects the "trigger" option with button 206 so that time is correlated with respect to the common trigger. Other options aside from trigger are also available. For example, the user can select the option of having the listings correlate in time with respect to a certain number of states occurring before or after the trigger. When listing 191 is configured, listing 193 will automatically be configured correspondingly.

Once the listings have been configured, the marker, which is labeled G1 in the example shown, will be displayed in the listings 191 and 193. In the example shown, the time marked is 4.520 ms. This time corresponds to the start pattern 555 hex in listing 191 and instruction B9F5E200 EB00EBEE in listing 193. Therefore, the user is able to view the listings side by side and simultaneously look at what is occurring in microprocessor 165 and what is occurring at the same time on the communications channel 161. Furthermore, if the user wishes to change what is marked, the user can simply drag the marker G1 in listing 191 using a mouse to the time or state the user is interested in viewing. The marker G1 in listing 193 will then automatically be moved to the corresponding time in listing 193 and the windows will be updated such that the markers in the two listings are simultaneously visible on the display.

As stated above, the user can also specify a pattern as a marker. This is useful when, for example, a particular pattern corresponds to a message or a portion of a message being sent over the serial communications channel. When the user specifies a pattern as the marker, the marker will automatically appear in listing 191 where the pattern occurs and the marker will simultaneously appear in listing 193 marking the same time as the time at which the marker occurred in listing 191. Furthermore, when a pattern is selected, a count will appear in button 204. The user can then select the nth occurrence of the pattern.

A detailed discussion of the software implemented by the present invention to accomplish the aspects of the present invention discussed above with respect to FIG. 10 will not be provided herein because persons skilled in the art will understand how to design such software in view of the discussion of FIGS. 9 and 10. Generally, the listing tool 11 receives the data from the logic analyzers 171 and 178 and utilizes the time tags which were stored in the acquisition RAM when the data was acquired by the logic analyzers 171 and 178 to track the markers within each of the listings 191 and 193 and to center the windows so that the markers are displayed for both of the listings. It will be apparent to those skilled in the art the manner in which this is accomplished.

It will be apparent to those skilled in the art that the present invention has been described only with respect to particular embodiments for purposes of illustrating the present invention and that the present invention is not limited to these embodiments. It will be apparent to those skilled in the art that many modifications may be made to the present invention without deviating from the spirit and scope of the present invention. It will also be apparent to those skilled in the art that there are many advantages to the present invention which have not been specifically pointed out and that all such advantages are included within the scope of the present invention. It will also be apparent to those skilled in the art that although the components of the present invention have been described as being comprised of hardware and/or software, the description of the components refers only to the preferred embodiments of the present invention for implementing the components. It will be understood by those skilled in the art that the goals of the present invention may be achieved using other implementations.

What is claimed is:

1. An apparatus for analyzing serial data received from a logic analyzer, the apparatus comprising:

a serial analyzer, the serial analyzer receiving serial data from a logic analyzer, the serial data comprised of a plurality of bits, the serial analyzer processing the serial data to convert the serial data into parallel words, each parallel word comprising a plurality of bits; and a listing tool, the listing tool receiving the parallel words and generating a listing to be displayed on a display device, wherein the apparatus is capable of analyzing serial data formatted in accordance with a plurality of different communications protocols.

2. The apparatus of claim 1, wherein the serial analyzer is comprised as a computer program being executed by a computer.

3. The apparatus of claim 1, wherein the listing tool is comprised as a computer program being executed by the computer.

4. The apparatus of claim 1, wherein the apparatus is capable of analyzing clocked or unclocked serial data.

5. The apparatus of claim 4, wherein when the serial data is unclocked, the serial analyzer utilizes a clock recovery method for sampling the unclocked serial data to reconstruct the serial data, the clock recovery method being accomplished by a computer program which is executed by a computer, wherein the clock recovery computer program determines when it is time to take a sample of the unclocked serial data by detecting edges in the unclocked serial data and calculating the time at which a sample of the unclocked serial data is to be taken based on the detection of an edge.

6. The apparatus of claim 1, wherein the listing tool is comprised as a computer program being executed by a computer, wherein the listing generated by the listing tool arranges the parallel words in a first column and the serial data in a second column such that a user is capable of simultaneously viewing at least one of the parallel words and the serial data corresponding to said at least one parallel word when the listing is displayed on the display.

7. The apparatus of claim 6, wherein the listing tool receives a time at which each bit of serial data was captured by the logic analyzer, and wherein the listing generated by the listing tool arranges the time of each bit of serial data in a third column such that a user is capable of simultaneously viewing said at least one parallel word, the serial data corresponding to said at least one parallel word, and the time at which each bit of said at least one parallel word was captured by the logic analyzer, when the listing is displayed on the display.

8. The apparatus of claim 7, wherein the listing tool receives a state at which each bit of serial data was captured by the logic analyzer, and wherein the listing generated by the listing tool arranges the state at which each bit of serial data occurred in a fourth column such that a user is capable of simultaneously viewing said at least one parallel word, the serial data corresponding to said at least one parallel word, the time at which each bit of said at least one parallel word was captured by the logic analyzer, and the states corresponding to each bit in said at least one parallel word, when the listing is displayed on the display.

9. The apparatus of claim 1, wherein prior to the serial analyzer processing the serial data to convert the serial data into parallel words, the serial analyzer selects specific bits contained in the serial data to convert into parallel words, wherein the serial analyzer selects the specific bits based on input received by the serial analyzer from a user.

10. The apparatus of claim 9, wherein the serial analyzer selects the specific bits to be converted based on the occurrence of a first pattern contained in the serial data, the first pattern being designated by a user and input into the serial analyzer, the serial analyzer converting all of the serial data bits occurring after the first pattern occurs into parallel words.

11. The apparatus of claim 10, wherein the serial analyzer stops converting the serial data into parallel words once a second pattern in the serial data is detected.

12. An apparatus for analyzing data received from a first logic analyzer and from a second logic analyzer, the first logic analyzer capturing serial data from a serial communication channel, the second logic analyzer acquiring words of data from a first device communicating over the serial communications channel, the apparatus comprising:

a serial analyzer, the serial analyzer receiving serial data from the first logic analyzer, the serial data comprised of a plurality of bits, the serial analyzer processing the serial data to convert the serial data into parallel words, each parallel word comprising a plurality of bits; and a listing tool, the listing tool receiving the parallel words and generating a first listing to be displayed on a display device, the listing tool receiving the data from the second logic analyzer and generating a second listing to be displayed on the display device.

13. The apparatus of claim 12, wherein the listing tool receives a time at which each bit of serial data was captured by the first logic analyzer and a time at which each word was captured by the second logic analyzer, wherein the first listing generated by the listing tool arranges the parallel words in a first column and the serial data in a second column such that a user is capable of simultaneously viewing at least one of the parallel words and the serial data corresponding to said at least one parallel word when the listing is displayed on the display, wherein the second listing generated by the listing tool can be correlated in time with the first listing such that when the first and second listings are displayed on the display, the user is capable of simultaneously viewing events occurring on the serial communications channel with events occurring in the first device.

14. The apparatus of claim 13, and wherein the first listing generated by the listing tool arranges the time of each bit of serial data in a third column such that a user is capable of simultaneously viewing said at least one parallel word, the serial data corresponding to said at least one parallel word, and the time at which each bit of said at least one parallel word was captured by the logic analyzer, when the listing is displayed on the display, wherein when the user marks a time in the first listing with a marker, the listing tool automatically marks a corresponding time in the second listing with a marker, wherein if the user changes the location of the marker in the first listing, the location of the marker in the second listing will automatically change to correspond to the changed location of the marker in the first listing, wherein the markers in each listing will be simultaneously displayed on the display to the user such that the user is capable of simultaneously viewing events occurring on the serial communications channel with events occurring in the first device.

15. An apparatus for analyzing serial data received from a logic analyzer, the apparatus comprising:

means for analyzing serial data, wherein the means for analyzing serial data receives serial data from a logic analyzer, the serial data comprised of a plurality of bits, the means for analyzing serial data processing the serial data to convert the serial data into parallel words, each parallel word comprising a plurality of bits; and means for generating a listing, wherein said means for generating a listing receives the parallel words and generates a listing to be displayed on a display device, wherein the apparatus is capable of analyzing serial data formatted in accordance with a plurality of different communications protocols.

16. The apparatus of claim 15, wherein the apparatus is capable of analyzing clocked or unclocked serial data.

17. The apparatus of claim 16, wherein when the serial data is unclocked, the means for analyzing serial data utilizes a clock recovery method for sampling the unclocked serial data to reconstruct the serial data, the clock recovery method being accomplished by a computer program which is executed by a computer, wherein the clock recovery computer program determines when it is time to take a sample of the unclocked serial data by detecting edges in the unclocked serial data and calculating the time at which a sample of the unclocked serial data is to be taken based on the detection of an edge.

18. The apparatus of claim 17, wherein the listing generated by the listing tool arranges the parallel words in a first column and the serial data in a second column such that a user is capable of simultaneously viewing at least one of the parallel words and the serial data corresponding to said at least one parallel word when the listing is displayed on the display.

19. The apparatus of claim 18, wherein the means for listing receives a time at which each bit of serial data was captured by the logic analyzer, and wherein the listing generated by the means for listing arranges the time of each bit of serial data in a third column such that a user is capable of simultaneously viewing said at least one parallel word, the serial data corresponding to said at least one parallel word, and the time at which each bit of said at least one parallel word was captured by the logic analyzer, when the listing is displayed on the display.

20. The apparatus of claim 19, wherein the means for listing receives a state at which each bit of serial data was captured by the logic analyzer, and wherein the listing generated by the means for listing arranges the state at which each bit of serial data occurred in a fourth column such that a user is capable of simultaneously viewing said at least one parallel word, the serial data corresponding to said at least one parallel word, the time at which each bit of said at least one parallel word was captured by the logic analyzer, and the states corresponding to each bit in said at least one parallel word, when the listing is displayed on the display.

21. An apparatus for analyzing data received from a first logic analyzer and from a second logic analyzer, the first logic analyzer capturing serial data from a serial communication channel, the second logic analyzer acquiring words of data from a first device communicating over the serial communications channel, the apparatus comprising:

means for analyzing serial data, the means for analyzing serial data receiving serial data from the first logic analyzer, the serial data comprised of a plurality of bits, the serial analyzer processing the serial data to convert the serial data into parallel words, each parallel word comprising a plurality of bits; and means for generating a listing, wherein the means for generating a listing receives the parallel words and generates a first listing to be displayed on a display device, and wherein the means for listing receives the data from the second logic analyzer and generates a second listing to be displayed on the display device.

22. The apparatus of claim 21, wherein the means for listing receives a time at which each bit of serial data was captured by the first logic analyzer and a time at which each word was captured by the second logic analyzer, wherein the first listing generated by the means for listing arranges the parallel words in a first column and the serial data in a second column such that a user is capable of simultaneously viewing at least one of the parallel words and the serial data corresponding to said at least one parallel word when the listing is displayed on the display, wherein the second listing generated by the means for listing can be correlated in time with the first listing such that when the first and second listings are displayed on the display, the user is capable of simultaneously viewing events occurring on the serial communications channel with events occurring in the first device.

23. The apparatus of claim 22, and wherein the first listing generated by the means for listing arranges the time of each bit of serial data in a third column such that a user is capable of simultaneously viewing said at least one parallel word, the serial data corresponding to said at least one parallel word, and the time at which each bit of said at least one parallel word was captured by the first logic analyzer, when the listing is displayed on the display, wherein when the user marks a time in the first listing with a marker, the means for listing automatically marks a corresponding time in the second listing with a marker, wherein if the user changes the location of the marker in the first listing, the location of the marker in the second listing will automatically change to correspond to the changed location of the marker in the first listing, wherein the markers in each listing will be simultaneously displayed on the display to the user such that the user is capable of simultaneously viewing events occurring on the serial communications channel with events occurring in the first device.

24. A computer-readable medium having a computer program for analyzing serial data, the program comprising a code segment for determining when a serial data sample is a valid sample, the code segment detecting transitions occurring in the serial data, the transitions corresponding to changes in the serial data from a digital 1 to a digital 0 or from digital 0 to a digital 1, the code segment determining the time at which a transition in the serial data occurs and utilizing the time at which a transition occurs to calculate whether a serial data sample is a valid sample, wherein of the code segment determines that a serial data sample is a valid sample, the code segment causes the sample to be used as representative sample.

25. A method for analyzing serial data comprising the steps of:

receiving serial data from a logic analyzer into a serial analyzer, the serial data comprised of a plurality of bits;

processing the serial data in the serial analyzer to convert the serial data into parallel words, each parallel word comprising a plurality of bits; and utilizing a listing tool to generate a listing to be displayed on a display device wherein the method is capable of analyzing serial data formatted in accordance with a plurality of different communications protocols.

26. The method of claim 25, wherein when the serial data is unclocked, the step of processing includes utilizing a clock recovery method for sampling the unclocked serial data to reconstruct the serial data, the clock recovery method being accomplished by a computer program which is executed by a computer, wherein the clock recovery computer program determines when it is time to take a sample of the unclocked serial data by detecting edges in the unclocked serial data and calculating the time at which a sample of the unclocked serial data is to be taken based on the detection of an edge.

27. The method of claim 26, wherein the listing tool is comprised as a computer program being executed by a computer, wherein the listing generated by the listing tool arranges the parallel words in a first column and the serial data in a second column such that a user is capable of simultaneously viewing at least one of the parallel words and the serial data corresponding to said at least one parallel word when the listing is displayed on the display.

28. The method of claim 27, wherein the listing tool receives a time at which each bit of serial data was captured by the logic analyzer, and wherein the listing generated by the listing tool arranges the time of each bit of serial data in a third column such that a user is capable of simultaneously viewing said at least one parallel word, the serial data corresponding to said at least one parallel word, and the time at which each bit of said at least one parallel word was captured by the logic analyzer, when the listing is displayed on the display.

29. The method of claim 28, wherein the listing tool receives a state at which each bit of serial data was captured by the logic analyzer, and wherein the listing generated by the listing tool arranges the state at which each bit of serial data occurred in a fourth column such that a user is capable of simultaneously viewing said at least one parallel word, the serial data corresponding to said at least one parallel word, the time at which each bit of said at least one parallel word was captured by the logic analyzer, and the states corresponding to each bit in said at least one parallel word, when the listing is displayed on the display.

30. A method for analyzing data received from a first logic analyzer and from a second logic analyzer, the first logic analyzer capturing serial data from a serial communication channel, the second logic analyzer acquiring words of data from a first device communicating over the serial communications channel, the method comprising the steps of:

receiving serial data from the first logic analyzer in a serial analyzer, the serial data comprised of a plurality of bits;

processing the serial data in the serial analyzer to convert the serial data into parallel words, each parallel word comprising a plurality of bits; and utilizing a listing tool for generating first and second listings to be displayed on a display device, the listing tool receiving the parallel words and generating the first listing, the listing tool receiving the data from the second logic analyzer and generating a second listing to be displayed on the display device.

31. The method of claim 30, wherein the listing tool receives a time at which each bit of serial data was captured by the first logic analyzer and a time at which each word was captured by the second logic analyzer, wherein the first listing generated by the listing tool arranges the parallel words in a first column and the serial data in a second column such that a user is capable of simultaneously viewing at least one of the parallel words and the serial data corresponding to said at least one parallel word when the listing is displayed on the display, wherein the second listing generated by the listing tool can be correlated in time with the first listing such that when the first and second listings are displayed on the display, the user is capable of simultaneously viewing events occurring on the serial communications channel with events occurring in the first device.

32. The apparatus of claim 31, and wherein the first listing generated by the listing tool arranges the time of each bit of serial data in a third column such that a user is capable of simultaneously viewing said at least one parallel word, the serial data corresponding to said at least one parallel word, and the time at which each bit of said at least one parallel word was captured by the logic analyzer, when the listing is displayed on the display, wherein when the user marks a time in the first listing with a marker, the listing tool automatically marks a corresponding time in the second listing with a marker, wherein if the user changes the location of the marker in the first listing, the location of the marker in the second listing will automatically change to correspond to the changed location of the marker in the first listing, wherein the markers in each listing will be simultaneously displayed on the display to the user such that the user is capable of simultaneously viewing events occurring on the serial communications channel with events occurring in the first device.

* * * * *

UNITED STATES PATENT AND TRADEMARK OFFICE
CERTIFICATE OF CORRECTION

PATENT NO. : 6,148,420
DATED : November 14, 2000
INVENTOR(S) : Rodney T. Schlater and Patricia A. Desautels It is certified that error appears in the above-identified patent and that said Letters Patent is hereby corrected as shown below:

<u>Title page,</u>
Item [57], ABSTRACT,
Line 1, delete "inventions" and insert therefor -- invention --.

Signed and Sealed this

First Day of April, 2003

JAMES E. ROGAN
*Director of the United States Patent and Trademark Office*